Jan. 8, 1963 A. BADMAIEFF 3,072,795

REMOTE VOLUME CONTROL

Filed May 12, 1961

ALEXIS BADMAIEFF
INVENTOR.

BY Lyon & Lyon

ATTORNEYS

United States Patent Office 3,072,795
Patented Jan. 8, 1963

3,072,795
REMOTE VOLUME CONTROL

Alexis Badmaieff, Santa Ana, Calif., assignor to Altec Lansing Corporation, Anaheim, Calif., a corporation of Delaware Filed May 12, 1961, Ser. No. 109,534
2 Claims. (Cl. 250—209)

This invention relates to volume controls employed for remote control of signals and, more particularly, to an improvement in remote volume controls.

Remote volume controls of the type that are employed for remotely controlling the amplitude of a signal applied from the output of a preamplifier to a power amplifier typically comprises two L pads or a T pad, either of which is provided with variable elements whereby control of the level of the signal being applied from one to the other of the two amplifiers is obtained. Multiwire conductors are required between a desired control location and the location of the amplifiers which are being controlled, to enable remote control to be effectuated. Beside the nuisance of running a multiple-wire conductor between an amplifier and the remote control location, the multiple-wire conductor must be adequately shielded for minimizing hum pickup. Furthermore, in order to insure as minimal a hum pickup as possible, usually it is necessary to transform the impedance of the circuits, using expensive impedance transformers.

An object of this invention is the provision of an inexpensive remote volume control.

Another object of this invention is the provision of a remote volume control wherein, in place of an expensive, shielded multiwire conductor running between a remote location and a control location, only inexpensive unshielded conductors need be used.

Yet another object of this invention is the provision of a novel, useful, and a simple remote volume control.

These and other objects of the invention are achieved in an arrangement wherein two cadmium-sulfide cells are used in a T pad configuration which operates as a volume control when the illumination falling on the cadmium-sulfide cells is varied. The illumination is provided by a light source, the intensity of which can be simply controlled by means of inexpensive linear potentiometers.

The novel features that are considered characteristic of this invention are set forth with particularity in the appended claims. The invention itself, both as to its organization and method of operation, as well as additional objects and advantages thereof, will best be understood from the following description when read in connection with the accompanying drawings, in which:

Figure 1:
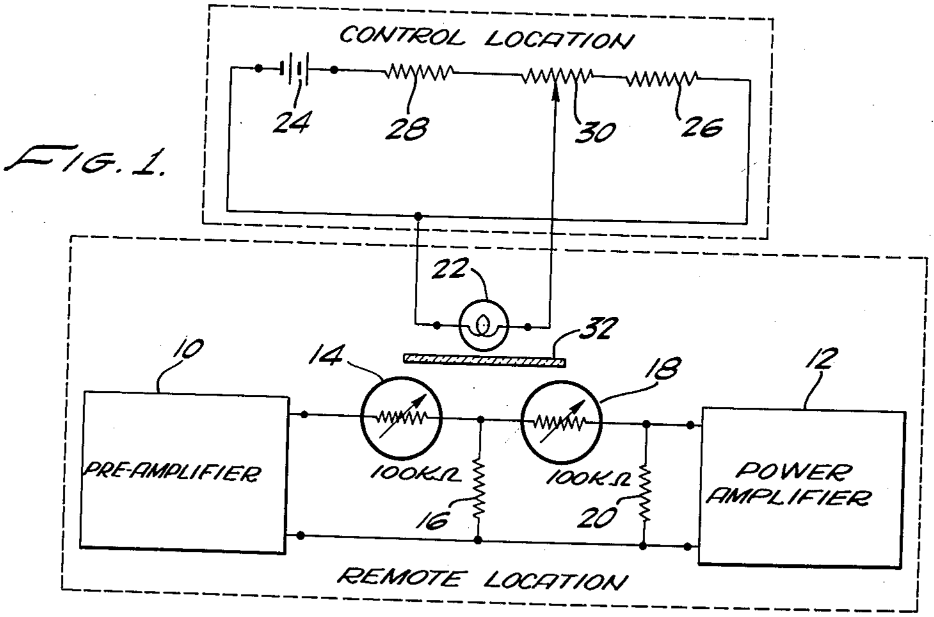
FIGURE 1 is a circuit diagram of an embodiment of the invention.

Referring now to FIGURE 1, by way of example, it is wished to control the level of the output signal from a preamplifier 10 which is being applied to a power amplifier 12. In accordance with this invention, a T pad, which is variable, is provided, consisting of a series-connected cadmium-sulfide cell 14, a shunt-connected resistor 15, and a second series-connected cadmium-sulfide cell 18. The cadmium-sulfide cells 14, 18, therefore, are in series with one another and are connected between the preamplifier and the power amplifier. A load resistor 20 is connected across the output of the T pad.

As is known, the resistance of a cadmium-sulfide cell decreases as the intensity of the illumination applied thereto increases, and the resistance increases with decrease in illumination. Accordingly, by controlling the intensity of the illumination received from a light source 22, the resistance of the cadmium cells may be controlled accordingly, and, as a result, the attenuation of the preamplifier signals by the T pad may be controlled. Electrical current for the lamp 22 is provided by a power source, represented by the battery 24. One side of this battery is connected to the lamp filament and to a resistor 26. The other side of this battery is connected to a resistor 28, which, in turn, is connected through the resistance of a potentiometer 30 to the other end of the resistor 26. The slider of the potentiometer 30 is connected to the other end of the filament of the lamp 22.

When the potentiometer 30 is adjusted so that its slider is at the end connected to resistance 26, the intensity of the illumination by the light bulb 22 is at its maximum. The value thereof is predetermined by the value of the resistance 26 which has been selected. Likewise the minimum value of the light intensity is determined by the resistance value selected for resistance 28.

When the maximum intensity value of the light source 22 is applied to the cadmium-sulfide cells 14, 18, the direct-current resistance of these cells is reduced and is quite small with reference to the values of the resistors 16 and 20. Employing the values for the various resistances as shown in FIGURE 1, the minimal attenuation of the T pad is only 0.6 db. However, when the potentiometer 30 is rotated to its minimum light position, the resistance of the two cadmium-sulfide cells becomes approximately 20 megohms. The T pad attenuation is then 80 db.

The resistance 28 is inserted in the circuit shown in order to enable the T pad to start to function from the minimum position of the potentiometer 28, since this resistance presets the required Kelvin temperature so as to allow the tungsten filament to radiate in the far infrared region. By adjusting the ratios of the supply voltage 24, the low-limiting resistor 28, the high-limiting resistor 26, and the remotely located potentiometer 30, and by selecting a proper tungsten filament lamp, almost any desired volume-control taper can be simulated. In an embodiment of this invention which was constructed, a 49-volt 17-milliampere bulb was used.

By inserting a "minus infrared" optical filter (green-yellow) 32, the infrared-sensitive region of the cadmium-sulfide cells is not stimulated, which, in turn, produces a much sharper slope in the relation between attenuation versus rotation of the potentiometer. The values selected for the components, as shown in FIGURE 1, provide a variation of the attenuation of the T pad versus the rotation of the potentiometer 30, which is substantially that of a standard audio-taper curve. This is the ideal taper characteristic currently used for all sound applications. It should be noted that all that is required between the remote location and the control location are two wires, which can be of any inexpensive variety and which need not be shielded from hum pickup, since all they contain is direct current for the lamp 32.

Figure 2:
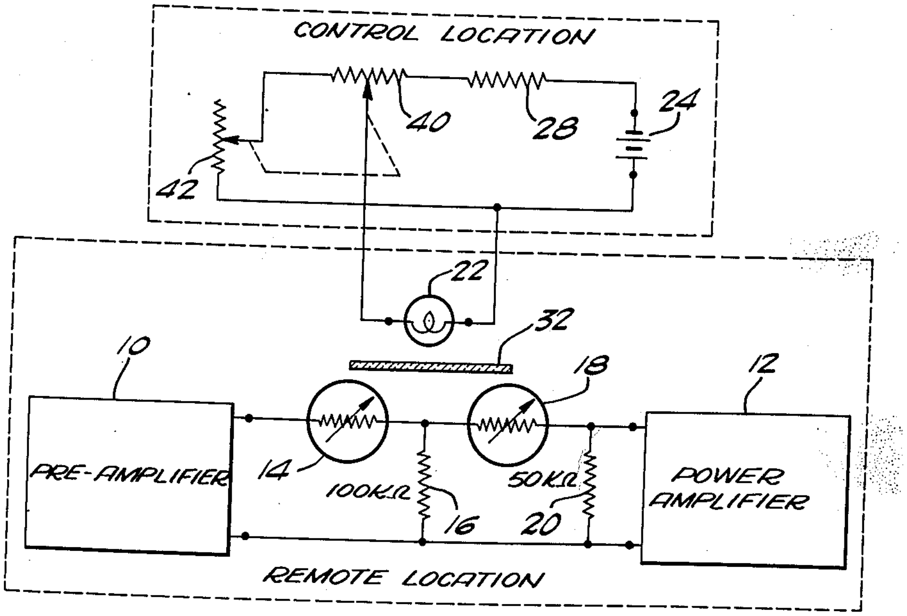
FIGURE 2 is a circuit diagram of another arrangement for the embodiment of the invention.

In certain applications where a linear log characteristic is desired, having a linear slope that centers at 20 db at fifty percent rotation, as is commonly used for precision step-type mixing attenuators, the circuit arrangement shown in FIGURE 2, using inexpensive linear carbon potentiometers, may be employed. Components in FIGURE 2, functioning similarly to those shown in FIGURE 1, are given the same reference numerals. Thus, the T pad has in its two series arms the cadmium-sulfide cells 14 and 18, the center shunt resistor 16, and the shunt load resistor 20. The T pad is connected between the output of the preamplifier and the input to the power amplifier 12. Light from a lamp 22 is allowed to fall on the cadmium-sulfide cells and, if desired, a filter 32 may be employed to remove the spectral waves in the infrared region from the light illuminating the cadmium-sulfide cells.

The power source comprises the battery 24, which has one side connected to a resistor 28. A first potentiometer 40 is connected in series with the resistor 28. The slider of the second potentiometer 42 is connected to the resistor of the potentiometer 40. The resistor of the potentiometer 42 is, in turn, connected back to the other side of the battery 24 and also to one side of the lamp 22. The other side of the lamp 22 is connected to the slider of the potentiometer 40.

The value of the resistance 20 in the circuit shown in FIGURE 2 has a value of 50,000 ohms, instead of 100,000 ohms, as was used previously. Further, the potentiometers 40 and 42 are ganged to be operable from the single shaft. Resistance 28 is employed to set the minimum light-source value, as before. As the potentiometers 40 and 42 are simultaneously actuated from their maximum to their minimum values, a substantially logarithmic variation is provided in the attenuation provided by the T pad. By permitting the slider of the potentiometer 40 to disconnect from the potentiometer resistance, at a five-degree rotation position, the light 22 is completely extinguished, and an attenuation of 100 db is achieved. This serves the purpose of having an off position in a mixing control, as is customary in all step-type mixing attenuators.

Another important feature of this invention is that, in both arrangements shown in FIGURES 1 and 2, no tapered potentiometer controls are used. In each case, the potentiometers 30 and 40 are of simple, linear carbon types, and, further, potentiometer 42 is also a linear carbon type. The use of the minus-infrared filter 32 considerably reduces the heat sink effect of the filament which can produce a thermal time lag in the control. Thus, by cutting off the infrared response region, considerably better and faster control is achieved. Likewise, by selection of other optical filters, many choices of taper can be achieved, when used in conjunction with correctly chosen linear potentiometer values. A very low wattage tungsten filament bulb is employed as the controlling element of the cadmium-sulfide cells, whereby the over-all control-circuit wattage required is reduced, which, in turn, enables low-power linear-carbon-control elements of the most inexpensive types to be used.

There has accordingly been described and shown herein a novel, useful, inexpensive, and improved remote volume control.

I claim:

1. A remote volume control comprising a pair of signal-input terminals, a pair of signal output terminals, a T pad connecting said pair of input terminals to said pair of output terminals, said T pad including a first and second photo-resistive member connected in series between one of said input terminals and one of said output terminals, said photo-resistive members being made of a material having a resistance which varies inversely with the illumination falling thereon, a center-leg resistor connected between said series-connected photo-resistive members and the other ones of said input and output terminals, a load resistor connected between said output terminals, a lamp positioned for illuminating said first and second photo-resistive members with the light therefrom, a filter positioned between said lamp and said first and second photo-resistive members for preventing illumination within a predetermined spectral range from reaching said photo-resistive members, a potentiometer having a resistance and a slider arm, means connecting one side of said lamp to said slider arm, a source of energy for said lamp having a pair of output terminals, means connecting the other side of said lamp with one of the pair of output terminals of said source of energy, a first resistor connecting one side of said potentiometer resistor to said one of said pair of energy-source output terminals, a second resistor connecting the other side of said potentiometer resistance to the other of said pair of energy-source output terminals whereby variation of said potentiometer varies the illumination reaching said photo-resistive members and thereby the attenuation provided by said T pad.

2. A remote volume control comprising a pair of signal-input terminals, a pair of signal output terminals, a T pad connecting said pair of input terminals to said pair of output terminals, said T pad including a first and second photo-resistive member connected in series between one of said input terminals and one of said output terminals, said photo-resistive members being made of a material having a resistance which varies inversely with the illumination falling thereon, a center-leg resistor connected between said series-connected photo-resistive members and the other ones of said input and output terminals, a load resistor connected between said output terminals, a lamp positioned for illuminating said first and second photo-resistive members with the light therefrom, a filter positioned between said lamp and said first and second photo-resistive members for preventing illumination within a predetermined spectral range from reaching said photo-resistive members, a first potentiometer having a resistor and a slider, a second potentiometer having a resistor and a slider, the slider of said first and second potentiometers being ganged for simultaneous movement, means connecting the slider of said second potentiometer to one end of the resistor of said first potentiometer, a source of energy, means connecting one side of said source of energy to one side of said lamp and to one side of the resistor of said second potentiometer, means connecting the other side of said lamp to said first potentiometer slider, and a resistor connecting the other side of said first potentiometer resistor to the other side of said source of energy.

References Cited in the file of this patent

UNITED STATES PATENTS

| | | |
|---|---|---|
| 2,461,254 | Bassett | Feb. 8, 1949 |
| 2,896,086 | Wunderman | July 21, 1959 |
| 2,967,945 | De Gier | Jan. 10, 1961 |
| 3,020,488 | De Miranda et al. | Feb. 6, 1962 |